United States Patent
Tate et al.

(10) Patent No.: US 10,848,182 B2
(45) Date of Patent: Nov. 24, 2020

(54) ITERATIVE DECODING WITH EARLY TERMINATION CRITERION THAT PERMITS ERRORS IN REDUNDANCY PART

(71) Applicant: Apple Inc., Cupertino, CA (US)

(72) Inventors: Yonathan Tate, Kfar Saba (IL); Naftali Sommer, Rishon Lezion (IL); Asaf Landau, Modiin (IL); Armand Chocron, Haifa (IL)

(73) Assignee: APPLE INC., Cupertino, CA (US)

( * ) Notice: Subject to any disclaimer, the term of this patent is extended or adjusted under 35 U.S.C. 154(b) by 58 days.

(21) Appl. No.: 16/130,003

(22) Filed: Sep. 13, 2018

(65) Prior Publication Data

US 2020/0091933 A1    Mar. 19, 2020

(51) Int. Cl.
*H03M 13/11* (2006.01)
*H03M 13/29* (2006.01)
*H03M 13/25* (2006.01)

(52) U.S. Cl.
CPC ..... *H03M 13/1105* (2013.01); *H03M 13/255* (2013.01); *H03M 13/2906* (2013.01); *H03M 13/2948* (2013.01)

(58) Field of Classification Search
CPC ......... H03M 13/3972; H03M 13/1105; H03M 13/616; H03M 13/1154; G06F 11/1076
See application file for complete search history.

(56) References Cited

U.S. PATENT DOCUMENTS

| | | |
|---|---|---|
| 4,414,623 A | 11/1983 | Davis et al. |
| 4,845,713 A | 7/1989 | Zook |
| 5,267,242 A | 11/1993 | Levalee et al. |

(Continued)

FOREIGN PATENT DOCUMENTS

| | | |
|---|---|---|
| WO | 2007052991 A1 | 5/2007 |
| WO | 2007132453 A2 | 11/2007 |

(Continued)

OTHER PUBLICATIONS

Chase, D., "A Class of Algorithms for Decoding Block Codes with Channel Measurement Information", IEEE Transactions on Information Theory, vol. IT-18, No. 1, pp. 170-182, Jan. 1972.

(Continued)

*Primary Examiner* — Guy J Lamarre
(74) *Attorney, Agent, or Firm* — Kligler & Associates Patent Attorneys Ltd

(57) ABSTRACT

An apparatus includes an interface and a decoder. The interface is configured to receive a code word, produced in accordance with an Error Correction Code (ECC) represented by a set of parity check equations. The code word includes a data part and a redundancy part, and contains one or more errors. The decoder is configured to hold a definition of a partial subgroup of the parity check equations that, when satisfied, indicate that the data part is error-free with a likelihood of at least a predefined threshold, to decode the code word by performing an iterative decoding process on the parity check equations, so as to correct the errors, and during the iterative decoding process, to estimate whether the data part is error-free based only on the partial subgroup of the parity check equations, and if the data part is estimated to be error-free, terminate the iterative decoding process.

20 Claims, 4 Drawing Sheets

(56) References Cited

U.S. PATENT DOCUMENTS

| | | | |
|---|---|---|---|
| 5,887,005 A | 3/1999 | Sharma | |
| 5,887,006 A | 3/1999 | Sharma | |
| 6,031,875 A | 2/2000 | Im | |
| 6,047,395 A | 4/2000 | Zook | |
| 6,154,869 A | 11/2000 | Wolf | |
| 6,279,137 B1 | 8/2001 | Poeppelman et al. | |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,637,002 B1 | 10/2003 | Weng et al. | |
| 6,671,850 B1 | 12/2003 | Cox et al. | |
| 6,845,481 B2 | 1/2005 | Gueguen et al. | |
| 6,938,196 B2 | 8/2005 | Richardson et al. | |
| 6,982,659 B2 | 1/2006 | Shen et al. | |
| 7,114,086 B2 | 9/2006 | Mizuyabu et al. | |
| 7,184,351 B2 | 2/2007 | Ito et al. | |
| 7,184,352 B2 | 2/2007 | Klein et al. | |
| 7,206,992 B2 | 4/2007 | Xin | |
| 7,237,183 B2 | 6/2007 | Xin | |
| 7,475,103 B2 | 1/2009 | Novichkov et al. | |
| 7,478,310 B2 | 1/2009 | Jung et al. | |
| 7,590,923 B1 | 9/2009 | Kikuchi et al. | |
| 7,783,905 B2 | 8/2010 | Chang et al. | |
| 7,962,839 B1 | 6/2011 | Wu | |
| 8,139,426 B2 | 3/2012 | Park | |
| 8,327,242 B1 | 12/2012 | Anholt et al. | |
| 8,335,973 B2 | 12/2012 | Abe | |
| 8,429,498 B1 | 4/2013 | Anholt et al. | |
| 8,453,038 B2 | 5/2013 | Anholt | |
| 8,601,352 B1 | 12/2013 | Anholt et al. | |
| 8,661,326 B1 | 2/2014 | Li et al. | |
| 8,732,565 B2 | 5/2014 | Pisek et al. | |
| 8,977,934 B2 | 3/2015 | Ueng et al. | |
| 9,391,644 B2 | 7/2016 | Gadat et al. | |
| 9,432,053 B1 | 8/2016 | Graumann et al. | |
| 9,619,317 B1 | 4/2017 | Lu | |
| 2004/0181735 A1 | 9/2004 | Xin | |
| 2005/0246611 A1 | 11/2005 | Jin et al. | |
| 2006/0214820 A1 | 9/2006 | Kleihorst et al. | |
| 2007/0013816 A1 | 1/2007 | Martin | |
| 2007/0089025 A1 | 4/2007 | Hong et al. | |
| 2007/0162822 A1 | 7/2007 | Choi et al. | |
| 2007/0198895 A1 | 8/2007 | Paumier et al. | |
| 2008/0059867 A1* | 3/2008 | Lin | H03M 13/13 714/785 |
| 2008/0148133 A1 | 6/2008 | Duggan | |
| 2008/0172592 A1 | 7/2008 | Wehn et al. | |
| 2008/0198650 A1 | 8/2008 | Shalvi et al. | |
| 2009/0024905 A1 | 1/2009 | Shalvi et al. | |
| 2009/0070659 A1 | 3/2009 | Zhong et al. | |
| 2009/0077449 A1 | 3/2009 | Lee | |
| 2009/0094470 A1 | 4/2009 | Gao et al. | |
| 2009/0106485 A1 | 4/2009 | Anholt | |
| 2009/0187803 A1 | 7/2009 | Anholt et al. | |
| 2009/0199074 A1 | 8/2009 | Sommer | |
| 2009/0249159 A1 | 10/2009 | Lee et al. | |
| 2009/0282320 A1 | 11/2009 | Liao et al. | |
| 2010/0042906 A1* | 2/2010 | Gunnam | H03M 13/1111 714/780 |
| 2010/0275088 A1 | 10/2010 | Graef | |
| 2010/0275089 A1 | 10/2010 | Mow et al. | |
| 2010/0306626 A1 | 12/2010 | Keays et al. | |
| 2011/0107188 A1 | 5/2011 | Dror et al. | |
| 2013/0179748 A1* | 7/2013 | Dong | G06F 11/1012 714/755 |
| 2015/0207523 A1 | 7/2015 | Abu-Surra | |
| 2015/0303944 A1 | 10/2015 | Sunwoo et al. | |
| 2015/0381206 A1* | 12/2015 | Fainzilber | H03M 13/1108 714/758 |
| 2016/0080003 A1* | 3/2016 | Ma | G06F 11/1068 714/764 |
| 2017/0070239 A1 | 3/2017 | Hung | |
| 2017/0070243 A1 | 3/2017 | Hung | |
| 2017/0134050 A1 | 5/2017 | Abu-Surra et al. | |
| 2018/0123614 A1 | 5/2018 | Loncke et al. | |
| 2019/0068219 A1* | 2/2019 | Bhatia | H03M 13/1174 |
| 2020/0067528 A1* | 2/2020 | Arikan | H03M 13/6569 |

FOREIGN PATENT DOCUMENTS

| | | |
|---|---|---|
| WO | 2007132457 A2 | 11/2007 |
| WO | 2008026203 A2 | 3/2008 |
| WO | 2008053472 A2 | 5/2008 |
| WO | 2008139441 A2 | 11/2008 |
| WO | 2009053961 A2 | 4/2009 |
| WO | 2009072103 A2 | 6/2009 |
| WO | 2009072105 A2 | 6/2009 |
| WO | 2009074979 A2 | 6/2009 |

OTHER PUBLICATIONS

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding: fundamentals and applications", chapter 6, pp. 209-215; chapter 7, pp. 241-255; chapter 17.6, pp. 871-880, 2nd edition, Pearson Education, Inc., USA, 2004.

Yazdani et al., "On Construction of Rate-Compatible Low-Density Parity-Check Codes", IEEE Communication Letters, vol. 8, No. 3, pp. 159-161, Mar. 2004.

Gallager, R.G., "Low-Density Parity-Check Codes", 90 pages, Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Gallager, R.G., "Low-Density Parity-Check Codes", IRE Transactions on Information Theory, pp. 21-28, Jan. 1962.

Wu et al., "Parallel Weighted Bit-Flipping Decoding", IEEE Communication Letters, vol. 11, No. 08, pp. 671-673, Aug. 207.

Sharon et al., "Efficient Serial Message-Passing Schedules for LDPC Decoding", IEEE Transactions on Information Theory, vol. 53, No. 11, pp. 4076-4091, Nov. 2007.

Forney, D. G., "Generalized Minimum Distance Decoding", IEEE Transactions on Information Theory, vol. IT-12, No. 2, pp. 125-131, Apr. 1966.

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

(56) References Cited

OTHER PUBLICATIONS

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", 536 pages, Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), 6 pages, U.S. Virgin Islands, Nov. 2002.

Whiting, D.L., "Bit-Serial Reed-Solomon Decoders in VLSI", Doctor Thesis, California Institute of Technology, 156 pages, Aug. 22, 1984.

Darabiha et al., "Power Reduction Techniques for LDPC Decoders", IEEE Journal of Solid-State Circuits, vol. 43, No. 8, pp. 1835-1845, Aug. 2008.

Nitsche et al., "IEEE 802.11ad: directional 60 GHz communication for multi-Gigabit-per-second Wi-Fi," IEEE Communications Magazine, vol. 52, issue 12, pp. 132-141, Dec. 2014.

Sommer et al., U.S. Appl. No. 12/913,815, filed Oct. 28, 2010.

Stimming et al., "A Parallelized Layered QC-LDPC Decoder for IEEE 802.11ad", IEEE 11th International New Circuits and Systems Conference (NEWCAS), 4 pages, Jun. 16-19, 2013.

Ajaz et al., "Multi-Gb/s Multi-Mode LDPC Decoder Architecture for IEEE 802.11ad Standard", IEEE Asia Pacific Conference on Circuits and Systems (APCCAS), pp. 153-156, Nov. 17-20, 2014.

Weiner et al., "LDPC Decoder Architecture for High-Data Rate Personal-Area Networks", IEEE International Symposium of Circuits and Systems (ISCAS), pp. 1784-1787, May 15-18, 2011.

\* cited by examiner

FIG. 3B

PARITY CHECK MATRIX H OF THE RATE 1/2 IEEE 802.11ad LDPC CODE

ITERATIVE DECODING WITH EARLY TERMINATION CRITERION THAT PERMITS ERRORS IN REDUNDANCY PART

TECHNICAL FIELD

Embodiments described herein relate generally to Error Correction Coding (ECC), and particularly to methods and systems for terminating iterative decoding processes.

BACKGROUND

Error Correction Codes (ECC) are used in a variety of applications, such as in various digital communication and data storage applications. Some types of ECC such as Low Density Parity Check (LDPC) codes are sometimes decoded using iterative decoding processes. Various criteria for terminating such iterative processes have been described in the patent literature.

For example, U.S. Pat. No. 9,432,053 describes a method and decoder for decoding a Low Density Parity Check codeword. An additional check processor performs hard-decision processing functions on the LDPC codeword in order to avoid running unnecessary decoder iterations. The method comprises: receiving the ECC codeword at a memory, the received ECC codeword comprising ECC data bits, ECC parity bits, and error detection code bits; soft-decision decoding the received ECC codeword at a soft-decision decoder, to update the ECC codeword according to ECC parity check equations; hard-decision processing the received ECC codeword at a check processor, while the soft-decision decoder performs the soft-decision decoding, to verify the ECC data bits using the error detection code bits; terminating the soft-decision decoding when the ECC data bits are verified, regardless of whether the updated ECC codeword satisfies all of the ECC parity check equations; and, outputting the decoded ECC codeword from the memory after termination of the decoding.

U.S. Pat. No. 8,661,326 describes a Low Density Parity Check (LDPC) processing module and a termination module. The LDPC processing module is configured to receive a test codeword based on a codeword received over a communications channel, and perform, for each row of a parity check matrix, a processing operation on the test codeword. The LDPC processing module is configured to, once the processing operations have been performed for all the rows, repeat the processing operations. The termination module is configured to monitor progress of the LDPC processing module and selectively generate a termination signal in response to the test codeword being a valid codeword according to the parity check matrix. The LDPC processing module is further configured to terminate the processing operations in response to generation of the termination signal.

U.S. Patent Application Publication 2018/0123614 describes aspects that generally relate to methods and apparatus for decoding low density parity check (LDPC) codes, and more particularly to early termination techniques for Low-Density Parity-Check (LDPC) decoder architecture.

SUMMARY

An embodiment that is described herein provides an apparatus, including an interface and a decoder. The interface is configured to receive a code word, which was produced in accordance with an Error Correction Code (ECC) represented by a set of parity check equations, the code word includes a data part and a redundancy part and contains one or more errors. The decoder is configured to hold a definition of a partial subgroup of the parity check equations that, when satisfied, indicate that the data part of the code word is error-free with a likelihood of at least a predefined threshold, to decode the code word by performing an iterative decoding process on the set of parity check equations, so as to correct the one or more errors, and, during the iterative decoding process, to estimate whether the data part is error-free based only on the partial subgroup of the parity check equations, and, if the data part is estimated to be error-free, terminate the iterative decoding process.

In some embodiments, the decoder is configured to terminate the iterative decoding process even when one or more of the parity check equations, which do not belong to the partial subgroup, are not satisfied. In other embodiments, the decoder is configured to estimate whether the data part is error-free by calculating a syndrome only over the parity check equations in the subgroup, and checking whether the syndrome is indicative of at least one unsatisfied parity check equation in the subgroup. In yet other embodiments, the decoder includes (i) a register that stores decoded bits of the code word that update during the iterative decoding process, and (ii) a logic circuit that is hard-wired to bits of the register in accordance with the parity check equations in the subgroup, and the logic circuit is configured to perform, using the logic circuit, within a single clock cycle (i) reading the decoded bits from the register, and (ii) calculating the syndrome, based on the read bits, over the parity check equations in the subgroup.

In an embodiment, each data bit in the data part of the code word participates in a predefined first number of the parity check equations, and at least one redundancy bit in the redundancy part participates in a second number of the parity check equations that is smaller than the first number. In another embodiment, the decoder is configured to scan the parity check equations in W layers, each of the W layers includes a plurality of the parity check equations, and to hold the definition of the partial subgroup by identifying a partial subset of W' layers, so that W'<W.

There is additionally provided, in accordance with an embodiment that is described herein, a method, including, in a decoder for an Error Correction Code (ECC) represented by a set of parity check equations, holding a definition of a partial subgroup of the parity check equations that, when satisfied, indicate that a data part of the code word is error-free with a likelihood of at least a predefined threshold. A code word, which was produced in accordance with the ECC is received, the code word includes a data part and a redundancy part and contains one or more errors. The code word is decoded by performing an iterative decoding process on the set of parity check equations, so as to correct the one or more errors. During the iterative decoding process, a decision whether the data part is error-free is estimated based only on the partial subgroup of the parity check equations, and, if the data part is estimated to be error-free, terminating the iterative decoding process.

These and other embodiments will be more fully understood from the following detailed description of the embodiments thereof, taken together with the drawings in which:

BRIEF DESCRIPTION OF THE DRAWINGS

FIG. 3B is a diagram that schematically illustrates a parity check matrix of an LDPC code that can be decoded using the LDPC decoder of FIG. 3A, in accordance with an embodiment that is described herein.

DETAILED DESCRIPTION OF EMBODIMENTS

Overview

Figure 1:
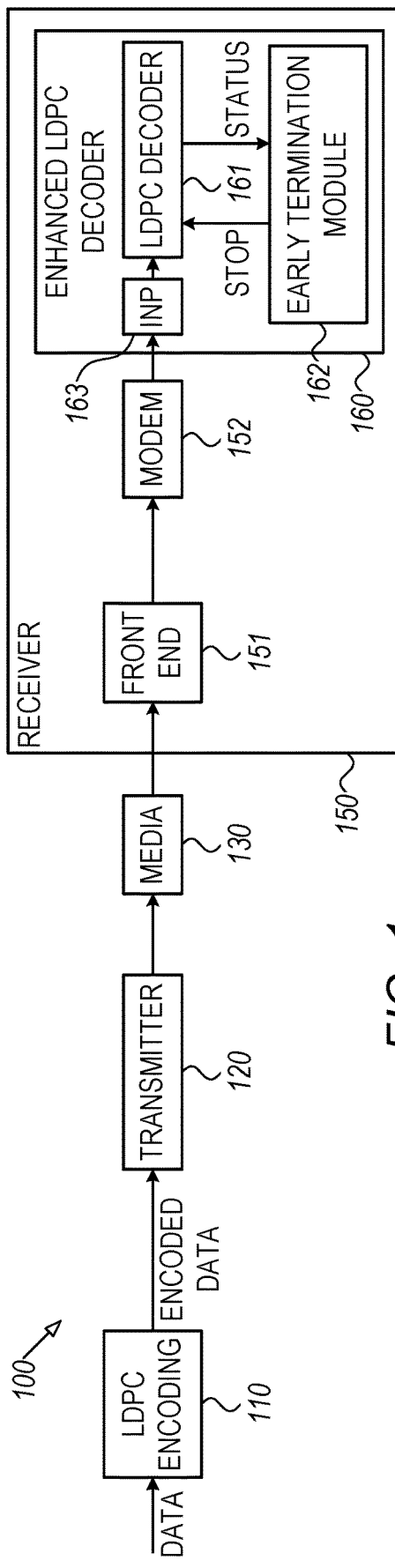
FIG. 1 is a block diagram that schematically illustrates a communication system employing Error Correction Coding (ECC) with early decoding termination, in accordance with an embodiment that is described herein.

Some types of ECC codes such as LDPC codes are often decoded in an iterative decoding process. In a typical iterative decoding process, code word bits are represented by respective bit nodes (also referred to as variable nodes), parity check equations are represented by respective check nodes, and the decoder attempts to converge to a valid code word by exchanging messages between the bit nodes and check nodes. The term "iteration" or "decoding iteration" is used herein to refer to a complete scan over the entire set of bit nodes and entire set of parity check equations (and thus the entire set of check nodes).

Power consumption and latency are prime considerations in many ECC decoding applications in general, and LDPC decoders in particular. In a communication system that uses an LDPC code, decoding latency is typically defined as the delay of the LDPC decoder from the time its input is valid to the time the corresponding decoded data is output. Similarly, in a memory system that uses an LDPC code, decoding latency is typically defined as the delay from the time data read from the memory array is input to the LDPC decoder until the decoded data is output.

When an LDPC code is decoded using an iterative decoding process, reducing the number of iterations causes a corresponding reduction in both latency and power consumption. Embodiments that are described herein provide improved methods and devices for early termination of iterative ECC decoding processes, thus achieving considerable savings in power consumption and latency in comparison with known solutions.

In conventional iterative decoding, after a valid code word has been reached, the decoder typically performs an additional decoding iteration for validating that all of the parity check equations are satisfied. For example, convergence to a valid code word may take seven iterations, but the decoder terminates after performing an eighth iteration, causing an additional cost of 14% in terms of power consumption and latency.

Consider a code word that comprises data bits and redundancy bits. Since for practical purposes only the data bits are of interest, it is sufficient to output data bits that contain no errors while ignoring possible errors in the redundancy bits. In some disclosed embodiments, the requirement of convergence to a valid code word is relaxed based on this observation, thus allowing for early termination of the decoding process, as will be described below.

ECC codes may be designed so that at least some code word bits participate in a smaller number of parity check equations than others. In such ECC codes, bits that participate in a small number of parity check equations can be corrected in a later stage of the iterative decoding process than bits that participate in a large number of parity check equations. Such ECC codes can be decoded with early terminations as described herein.

Consider an ECC code in which some of the redundancy bits participate in a number of parity check equations smaller than each of the data bits. The redundancy bits in such codes will typically be the last to be corrected in the iterative decoding process. This means that when the parity check equations, excluding those equations in which a small number of redundancy bits participate, are satisfied, there is high probability that the respective decoded bits contain errors only among the redundancy bits. The decoder may therefore terminate the decoding process even when one or more of the parity check equations are unsatisfied, and still provide data bits that with high probability match the data bits that were originally encoded to produce the code word.

In some embodiments, the decoder holds a definition of a partial subgroup of the parity check equations that, when satisfied, indicate that the data part of the code word is error-free with a likelihood of at least a predefined threshold. The partial subgroup is typically selected at design time. During the iterative decoding process, the decoder estimates whether the data part is error-free based only on the partial subgroup of the parity check equations, and, if the data part is estimated to be error-free, the decoder terminates the iterative decoding process. (Note, however, that each iteration of the iterative decoding process typically still comprises a complete scan over the entire set of parity check equations. The partial subset is considered only for the sake of termination decisions.) Using this decoding scheme, the decoder may terminate the iterative decoding process even when one or more of the parity check equations, which do not belong to the partial subgroup, are not satisfied.

In an embodiment, the decoder estimates whether the data part is error-free by calculating a syndrome only over the parity check equations in the subgroup, and checking whether the syndrome is indicative of at least one unsatisfied parity check equation in the subgroup. In some embodiments, the decoder comprises a logic circuit that is hardwired to bits of a register that holds current decoded bits, in accordance with the parity check equations in the subgroup. The logic circuit is configured to perform, using the logic circuit, within a single clock cycle (i) reading the decoded bits from the register, and (ii) calculating the syndrome, based on the read bits, over the parity check equations in the subgroup.

In an embodiment, the decoder scans the parity check equations in W layers, wherein each of the W layers comprises a plurality of the parity check equations. In this embodiment, the partial subgroup comprises a partial subset W' of the layers, wherein W'<W.

In the disclosed techniques a decoder terminates the decoding process when a selected partial subset of the check equations are satisfied, wherein at termination, the data bits of the code word contain no errors, with high probability. Such a termination scheme can be implemented efficiently in hardware and generate a termination signal within a single clock cycle.

System Description

FIG. 1 is a block diagram that schematically illustrates a communication system employing Error Correction Coding (ECC) with early decoding termination, in accordance with an embodiment that is described herein. In system 100, input data is encoded using a Low-density parity-check code (LDPC) encoder 110, and is then transmitted by a transmitter 120 through a communication channel (media) 130, which may be wireless or wire-line, to a receiver 150. Receiver 150 comprises a front end module 151, a modem 152 and an enhanced LDPC decoder 160.

Front end module 151 typically operates at a suitable Radio Frequency (RF), generating baseband signals that are input to modem 152. Modem 152 decodes the received transmission, and may have hard or soft outputs. Enhanced LDPC decoder 160 comprises an input circuit 163, which accepts input vectors (also referred to as input code words or input data) for decoding by the decoder. Decoder 160 further comprises an iterative LDPC decoder 161, which may comprise a soft iterative LDPC decoder. An early-termination module 162 determines whether the iterative process is to be terminated, according to criteria that will be described below, and signals a stop indication to LDPC decoder 161 in response to detecting that such a criterion is met.

Figure 2:
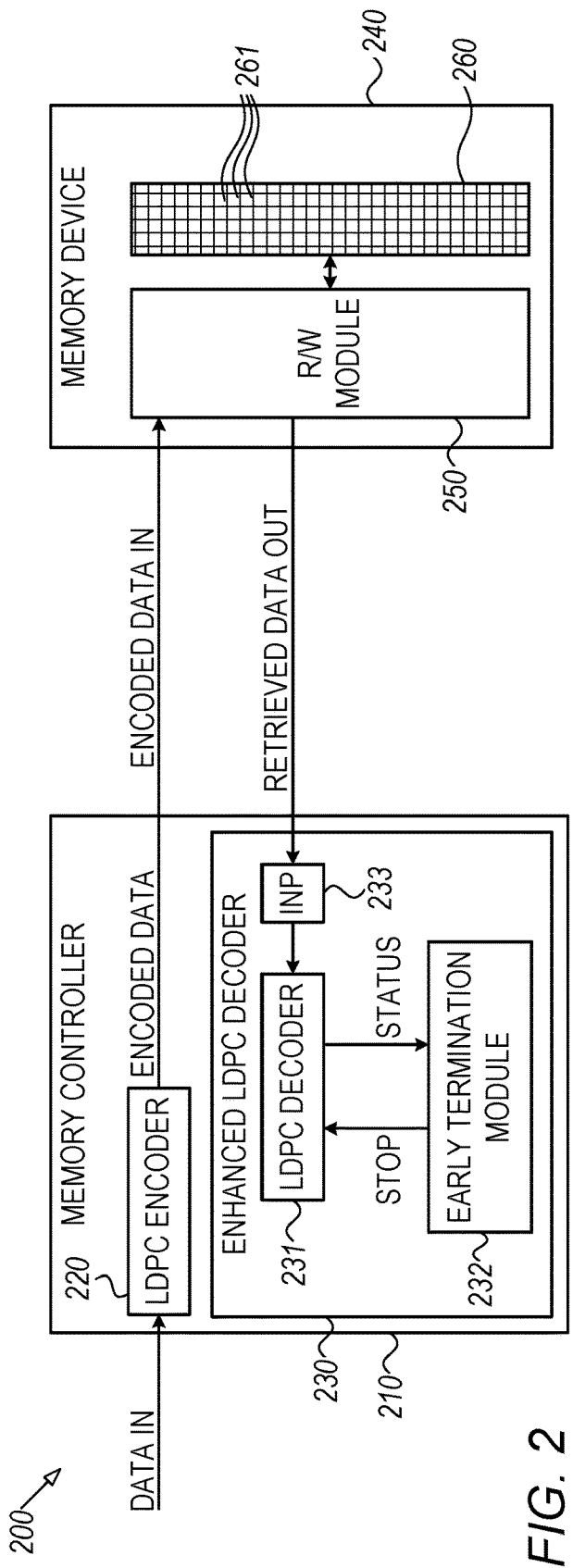
FIG. 2 is a block diagram that schematically illustrates a memory system that uses ECC with early decoding termination, in accordance with an embodiment that is described herein.

FIG. 2 is a block diagram that schematically illustrates a memory system 200 that uses ECC with early decoding termination, in accordance with an embodiment that is described herein. System 200 comprises a memory controller 210 that stores data in a memory device 240, and in particular applies ECC encoding to the data before being stored in the memory device, and ECC decoding to data retrieved from the memory device. Memory device 240 comprises a memory array 260, in which bits of data are stored in memory cells 261, and a Read/Write (R/W) module 250, which governs accesses to memory array 260. Memory array 260 may comprise any suitable type of memory, of any suitable storage technology, such as Flash memory.

Memory controller 210 in system 200 encodes the stored data using an LDPC code, in order to reduce the likelihood of errors. Data to be written into memory device 240 is first input to memory controller 210, which provides the data to a LDPC encoder 220 that adds redundancy bits to the input data bits, generating LDPC-encoded data. The memory controller then provides the LDPC-encoded data to memory device 240, which writes the LDPC-encoded data into memory array 260 using R/W module 250. When the memory controller reads data from memory device 240, the R/W module reads from memory array 260 LDPC-encoded data, which may include erroneous bits. Memory controller 210 receives the read data, and directed the read data to an enhanced LDPC decoder 230.

Enhanced LDPC decoder 230 comprises an input circuit 233, which accepts input vectors (also referred to as input code words or input data) for decoding by the decoder. Enhanced LDPC decoder 230 further comprises an iterative LDPC decoder 231 and an early-termination module 232. LDPC Decoder 231 may comprise a soft iterative LDPC decoder. Early-termination module 232 determines whether the iterative process is to be terminated, according to criteria that will be described below, and signals a stop indication to LDPC decoder 231 in response to detecting that such a criterion is met.

The techniques described below provide improved termination criteria for terminating the iterative LDPC decoding process. Any of the techniques described below can be applied by enhanced LDPC decoder 160 of FIG. 1, by enhanced LDPC decoder 230 in FIG. 2, or by any other suitable decoder used in any other suitable application that involves iterative ECC decoding.

The different elements of enhanced LDPC decoders 160 and 230 shown in FIGS. 1 and 2, including input circuits 163 and 233, iterative LDPC decoders 161 and 231 and early termination modules 162 and 232, as well as the different decoder elements shown in FIG. 3A below, e.g., IF 308, VN module 320, CN module 334, early termination module 350 and controller 326, may be implemented using hardware, such as using one or more discrete components, Application-Specific Integrated Circuits (ASICs) or Field-Programmable Gate Arrays (FPGAs). Alternatively, decoder elements may be implemented using software, or using a combination of hardware and software elements.

In some embodiments, one or more decoder elements are implemented using a general-purpose processor, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory.

Iterative Decoding with Efficient Early Termination

As noted above, since only the data bits of the code word are typically of interest, it is possible to terminate the iterative decoding when identifying that the data bits contain no errors, and ignoring possible errors in the redundancy bits. In some disclosed embodiments, the decoder terminates the decoding in response to estimating that the data bits are error-free, with high probability. Embodiments that implement such termination criterion will be described in detail below.

Figure 3A:
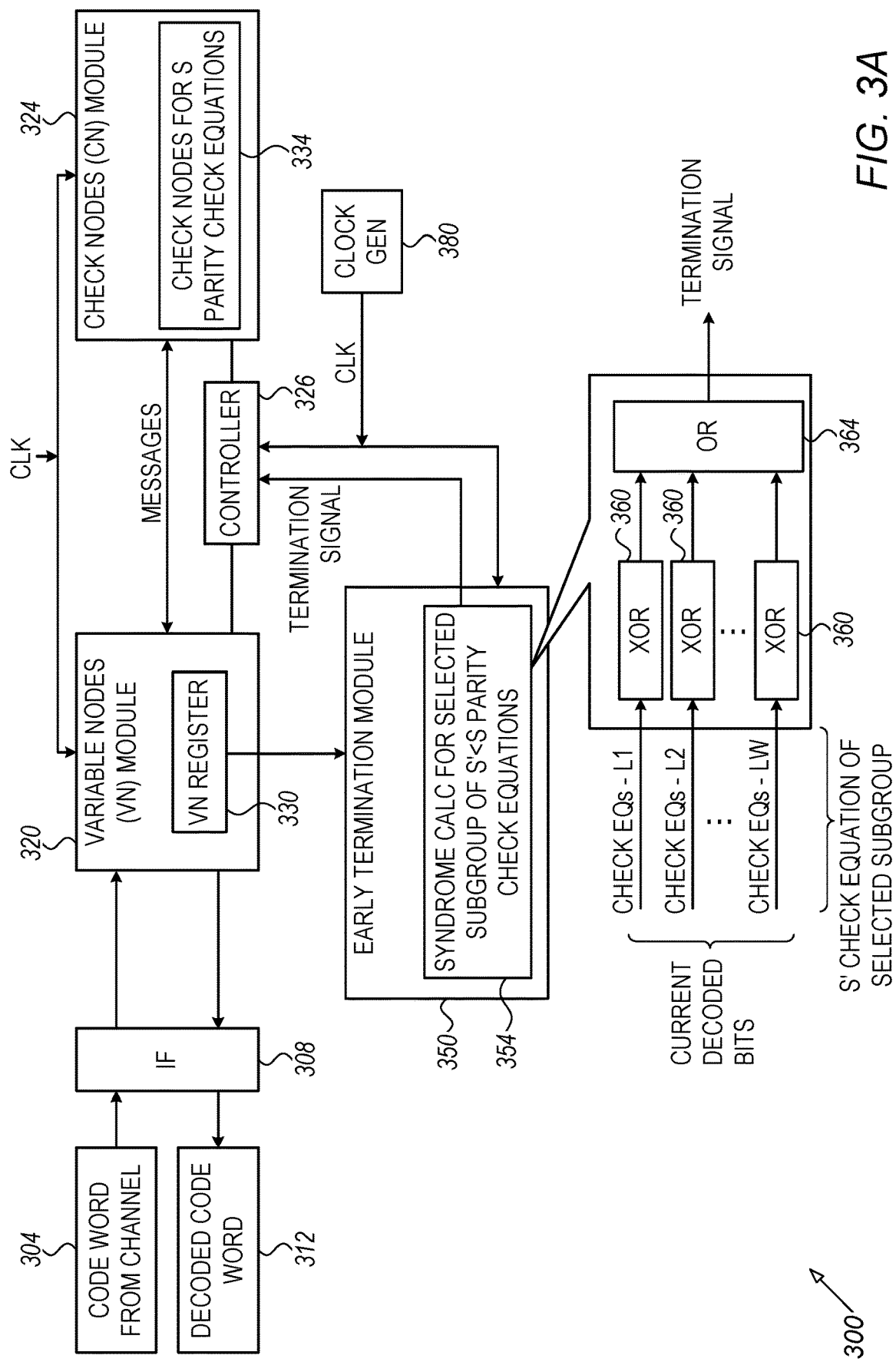
FIG. 3A is a block diagram that schematically illustrates an LDPC decoder that efficiently terminates an iterative decoding process, in accordance with an embodiment that is described herein.
Figure 3B:
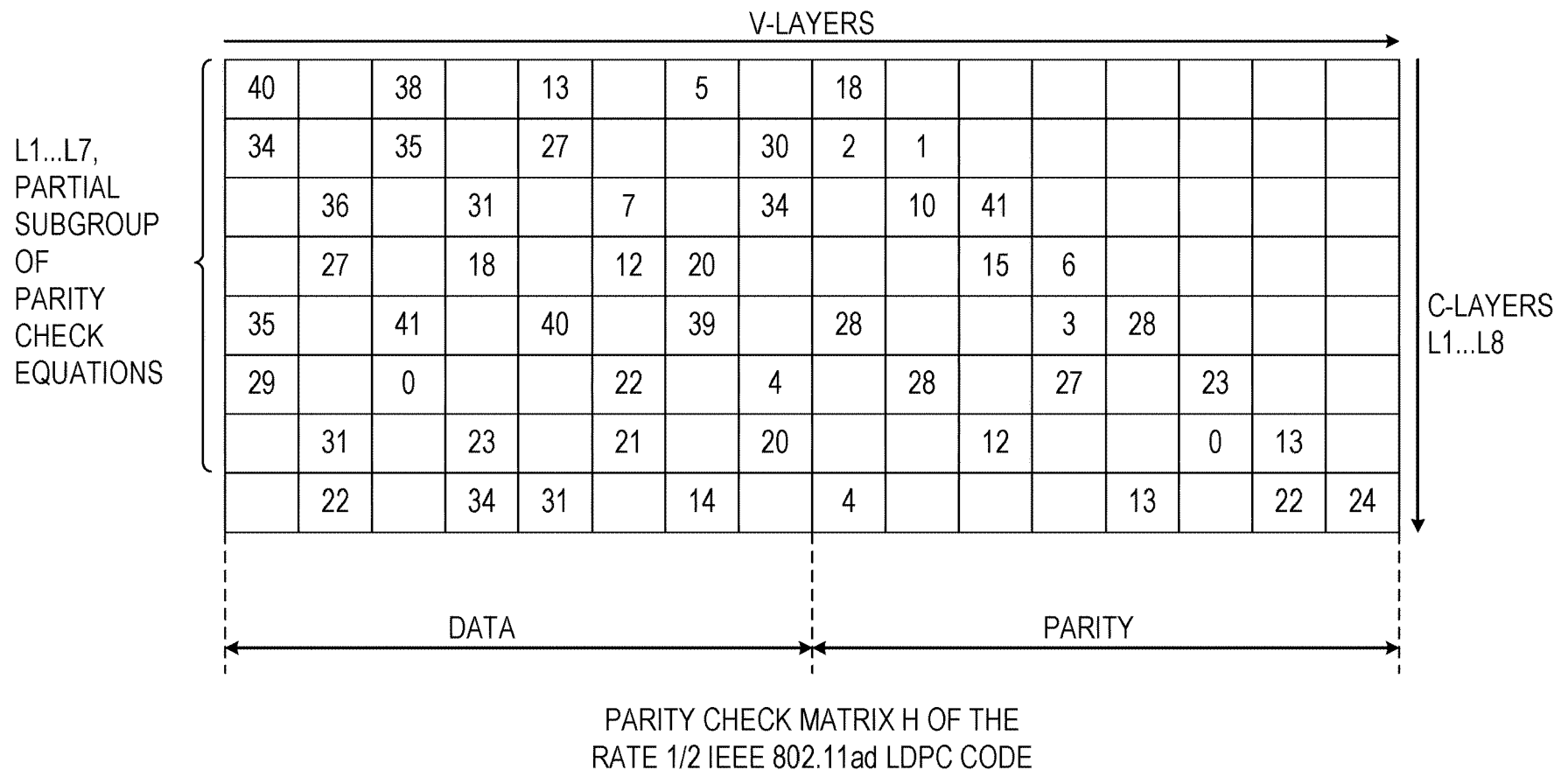

FIG. 3A is a block diagram that schematically illustrates an LDPC decoder 300 that efficiently terminates an iterative decoding process, in accordance with an embodiment that is described herein. FIG. 3B is a diagram that schematically illustrates a parity check matrix of an LDPC code that can be decoded using the LDPC decoder of FIG. 3A, in accordance with an embodiment that is described herein. LDPC decoder 300 can be used, for example, in implementing enhanced LDPC decoders 160 and 232 of FIGS. 1 and 2. The embodiments that will be described below are applicable to any other suitable ECC codes that are representable using a set of check equations.

The description that follows assumes that each code word of the LDPC code comprises N bits, and that the underlying LDPC code is represented using S parity-check equations. The LDPC code is thus representable using a parity check matrix that comprises S rows and N columns. The N bits of the code word comprises a data part of D data bits and a parity part of P redundancy bits, i.e., N=D+P, wherein the P redundancy bits were added to the D data bits by a LDPC encoder that produced the code word in accordance with the LDPC code.

LDPC decoder 300 receives input data, for example, an N-bit code word 304 for decoding, via an interface 308, and outputs a decoded version 312 of the received code word via interface 308. When decoding converges, the decoder typically outputs a valid code word. Otherwise, the decoder may output a decoding failure indication, in an embodiment. The input data is received from a channel that may cause errors to one or more of the N bits in code word 304. The channel models the various processing and interference that encoded code word undergoes between the LDPC encoder and LDPC decoder. Each erroneous bit in code word 304 can be a data bit or a redundancy bit.

In the present example, LDPC decoder 300 comprises a soft iterative decoder, such as a Belief-Propagation (BP) decoder or any other suitable type of soft decoder. LDPC decoder 300 comprises a variable nodes module 320 and a check nodes module 324 that exchange messages with one another in an iterative process controlled by a controller 326. The variable nodes module and the check nodes module are also referred to herein as "VN module" and "CN module," respectively.

VN module 320 comprises a variable nodes register (VN register) 330 that stores a numeric representation of the probabilities of the N bits (e.g., Log Likelihood Ratios—LLRs). Binary values of the N bits are derived from the VN register, e.g., based on the LLR signs. The binary values derived from the VN register are also referred to herein as "decoded bits." CN module 324 comprises check nodes 334 for generating messages for the VN module based on the S parity-check equations of the LDPC code.

Upon receiving messages from VN module 320, check nodes 334 calculates one or more CN messages using any suitable predefined CN function, such as "product-sum" or "min-sum" function. For example, the CN module calculates a message that may comprise an indication of whether a check equation corresponding to given check node is satisfied. Upon receiving messages from the CN module, the VN module calculates one or more VN messages to be sent to the CN module. The VN module may calculate any suitable predefined VN function, such as a bit-flipping function, that re-evaluates the values stored in the VN register. In some embodiments, e.g., when using soft decoding, a VN function that sums over all of the CN messages is commonly used.

In some embodiments, the CN module processes the check equations in groups that are referred to as "check layers" or "C-layers." Each C-layer corresponds, for example, to L parity check equations. Alternatively, different C-layers may comprise different respective numbers of parity check equations. In an embodiment, controller 326 schedules the iterative decoding in a row-layered order, also referred to as a "Serial C" order. In this embodiment, the CN module sends a message to the VN module after evaluating all of the check equations of a C-layer. This message typically comprises multiple messages corresponding to the multiple VN nodes.

LDPC decoder 300 comprises an early termination module 350. Based on the values currently stored in VN register 330, the early termination module generates a termination signal to controller 326. The termination signal is typically a binary valued signal that indicates to the controller to proceed or to stop the decoding process.

In the present example, early termination module 350 comprises a syndrome calculator 354, which calculates a syndrome vector over a partial subgroup of the full set of the check equations. The partial subgroup contains S'<S check equations that when are satisfied, the data bits among the decoded bits contain no errors, with high probability. In some embodiments, the ECC is designed and the subgroup is selected so that at termination, the likelihood of the data bits being error-free is higher than a predefined likelihood threshold. This likelihood threshold can be calibrated for example, for worst case conditions, such as the lowest expected Signal to Noise Ratio (SNR).

In general, early termination based on S'<S parity check equation cannot outperform termination using the full set of S parity check equations. The likelihood threshold can be equivalently specified in terms of error probabilities, as explained herein. Let "DE" denote the probability of errors in the data bits at termination. Denoting Prob(DE/S) and Prob(DE/S') as the respective probabilities of having errors in the data part of the code word at termination based on S and S' parity check equations, then essentially Prob(DE/S) ≤Prob(DE/S'). The subgroup S' can be selected so that Prob(DE/S') is limited relative to Prob(DE/S), for example, by some factor. For example, with a factor of 2, Prob(DE/S') satisfies Prob(DE/S)≤Prob(DE/S')<2·Prob(DE/S).

A parity check equation in the subgroup is satisfied when the respective element in the syndrome vector equals zero. Note that the early termination module is aware of the values of the decoded bits in VN register 330 at all times, and immediately responses to any change in the content of the VN register.

In some embodiments, controller 326 schedules the iterative decoding of LDPC decoder 300 in accordance with a serial-C scheduling, in which case the controller scans the S check equations in a predefined order, e.g., one C-layer at a time. In the example of FIG. 3A and of FIG. 3B, which will be described below, the controller scans the C-layers denoted L1 ... L8, e.g., sequentially from L1 to L8. In such an embodiment, each of check nodes 334 handles 42 parity check equations in parallel. In some embodiments, a check node evaluates a parity check equation over multiple groups of variable nodes in parallel. For example, in FIG. 3B there are up to eight 42-bit groups per a V-layer, so that these eight groups are processed in parallel.

Assuming that LDPC decoder 300 (for the LDPC code defined by the parity check matrix of FIG. 3B) processes a C-layer in a single clock cycle, performing a full iteration of the matrix in FIG. 3B requires eight clock cycles.

As noted above, syndrome calculator 354 checks only a partial subgroup S' of the entire S parity check equations. In the example of FIG. 3B, the syndrome calculator checks only the parity check equations of C-layers L1 ... L7, and ignores the parity check equations of C-layer L8. In some embodiments, the syndrome calculator calculates the syndrome corresponding to the parity check equations in the subgroup simultaneously, e.g., the decoder calculates 42·7=294 parity check equations in parallel, in this example.

In an embodiment, syndrome calculator 354 is implemented efficiently using a logic circuit that comprises multiple XOR modules 360 and an OR module 364. The inputs to the logic circuit are hard-wired to bits of the VN register in accordance with the parity check equations in the subgroup.

In the present example, each XOR module 360 corresponds to a respective C-layer, and evaluates the L parity check equations of the C-layer. The XOR module calculates for each parity check equation, a logical XOR operation among the binary values (decoded bits) of the variable nodes that participate in the parity check equation.

OR module 364 generates the termination signal by calculating a logical OR operation among the 7·42 outputs of the XOR modules. As such, the termination signal gets a binary value '0' only when all of the S' parity check equations in the subgroup are satisfied, and a binary value '1' otherwise.

In some embodiments, XOR module 360 comprises multiple XOR gates arranged in a XOR tree hierarchy. For example, using two-input XOR gates, the XOR tree has Ceil[$Log_2(L)$] degrees. Similarly, in an embodiment, OR module 364 is implemented using multiple OR gates arranged in an OR tree hierarchy. For example, using two-input OR gates, the OR tree has Ceil[$Log_2(L·W')$] degrees, wherein W' is the number of C-layers in the subgroup of the parity check equations.

LDPC decoder 300 in FIG. 3A comprises a clock generator that generates one or more clock signals for operating the various elements of the decoder, such as VN module 320, CN module 324, controller 326 and early termination module 350. In some embodiments, the decoder carries out several operations in parallel within a single clock cycle. For example, the decoder performs a bi-directional message exchange between the VN module and CN module, updating the values of the decoded bits in VN register 330, and generating a termination signal by the early termination module, within a single clock cycle. Specifically, the logic circuit of syndrome calculator 354 (i) reads the current values of the decoded bits from the VN register, and (ii) calculates, based on the read bits, the syndrome over the parity check equations in the subgroup, in a single clock cycle.

In the example of FIG. 3A, the decoded bits that are updated during the decoding process are stored in VN register 330. Such an implementation is typically suitable for communication applications that use relatively short-length code words. In alternative embodiments, the decoder may store the decoded bits in some memory (not shown) such as a Random Access Memory (RAM) device.

Selection of Parity Check Equations in the Subgroup for Efficient Early Termination Code word 304 comprises data bits plus redundancy bits that were added by the ECC encoder. Since the data bits are actually of interest, identifying decoded bits in which all the data bits are correct is sufficient, even when one or more of the redundancy bits are still erroneous.

In some embodiments, the underlying ECC code is designed so that one or more of the check equations are affected mainly by the parity bits. This may occur, for example, when one or more of the redundancy bits participate in a small number of check equations.

Next we describe some principles that may be used in designing the ECC code and in selecting the subgroup of parity check equations for efficient early termination in the ECC decoding. To this end we refer to the example parity check matrix of FIG. 3B. The LDPC code represented by the parity check matrix of FIG. 3B is specified, for example, in "IEEE 802.11ad: directional 60 GHz communication for multi-Gigabit-per-second Wi-Fi," IEEE Communications Magazine, volume 5 2, issue 12, December 2014.

The parity check matrix of FIG. 3B, denoted "H", comprises 336 parity check equations that are grouped in eight C-layers of L=42 parity check equations per C-layer. The parity check equations are defined over 672 variables that are grouped in 16 variable layers ("V-layers"), wherein each V-layer corresponds to L=42 variables.

The underlying LDPC code has a rate 1/2, indicating, for example, that the code word comprises the same number of data bits and parity bits. This LDPC code thus encodes a number of 336 data bits into a code word having 672 bits. The present LDPC code comprises a quasi-cyclic LDPC code, whose parity check matrix comprises L-by-L blocks, wherein in the present example L=42. In FIG. 3B, each numbered block represents an L-by-L circulant matrix, i.e., an L-by-L identity matrix shifted cyclically by the respective number. Non-numbered blocks in FIG. 3B represent L-by-L zero matrices. The parity check matrix thus comprises a total number of 8·16=128 42-by-42 blocks.

As shown in FIG. 3B, H comprises left and right parts (submatrices), corresponding respectively to data bits and parity bits. In each block-column of the data bits, four circulant matrices are numbered, i.e., each data bit participates in four parity check equations. On the other hand, the right submatrix of H comprises a block lower triangular matrix, and the number of numbered circulant matrices per block-column reduces from four to one. In the rightmost block column, only the bottom circulant matrix is numbered, which means that each of the 42 rightmost parity bits participate in only one parity check equation.

In iterative decoding of the LDPC code represented by the parity check matrix of FIG. 3B, the rightmost 42 parity bits are likely to be the last to be corrected. Note that the 42 rightmost parity bits affect only the parity check equations belonging to C-layer L8, and therefore, when all the parity check equations in L1 . . . L7 are satisfied, the data bits are likely to contain no errors. Consequently, the parity check equations that should be included in the subgroup for effective early termination include the parity check equations in L1 . . . L7. A termination criterion that is based on satisfying the check equations in L1 . . . L7 and ignoring those in L8 reduces average decoding time and power consumption. In such an embodiment, the parity check equations are selected to be included in the subgroup in full layers, i.e., all of the check equations in a given layer are included in the subgroup or excluded from the subgroup.

Note that the early termination scheme used in LDPC decoder 300 may result in false positive events. This means that upon early termination, the resulting data bits may contain one or more errors, with a low probability.

Using computer simulations, the inventors have tested an implementation of a LDPC decoder for the LDPC code represented by the parity check matrix of FIG. 3B. Specifically, the decoding latency and the decoding performance were compared, with and without including the 42 parity check equations of the decoding layer L8 for the purpose of terminating the decoding. The simulated LDPC decoder operates in a serial C mode, and executes a full decoding iteration over L1 . . . L8 in eight clock cycles. The inventors have found that by skipping the parity check equations in C-layer L8, for the purpose of early termination, the average number of clock cycles required for decoding reduces by eight clock cycles, with no apparent reduction in decoding performance. Moreover, due to reduction in the average decoding time (activity factor) this decoding scheme is expected to result in an average reduction of 28% in power consumption.

Using computer simulations, the inventors also found that when early termination results in a false positive, the decoder would converge to a wrong valid code word, if avoiding early termination, with high probability. In some embodiments, to identify cases of false positives, multiple code words are protected using some error detection code, e.g., Cyclic Redundancy Check (CRC) code, which is verified at a higher processing level than the ECC decoder itself.

Figure 4:
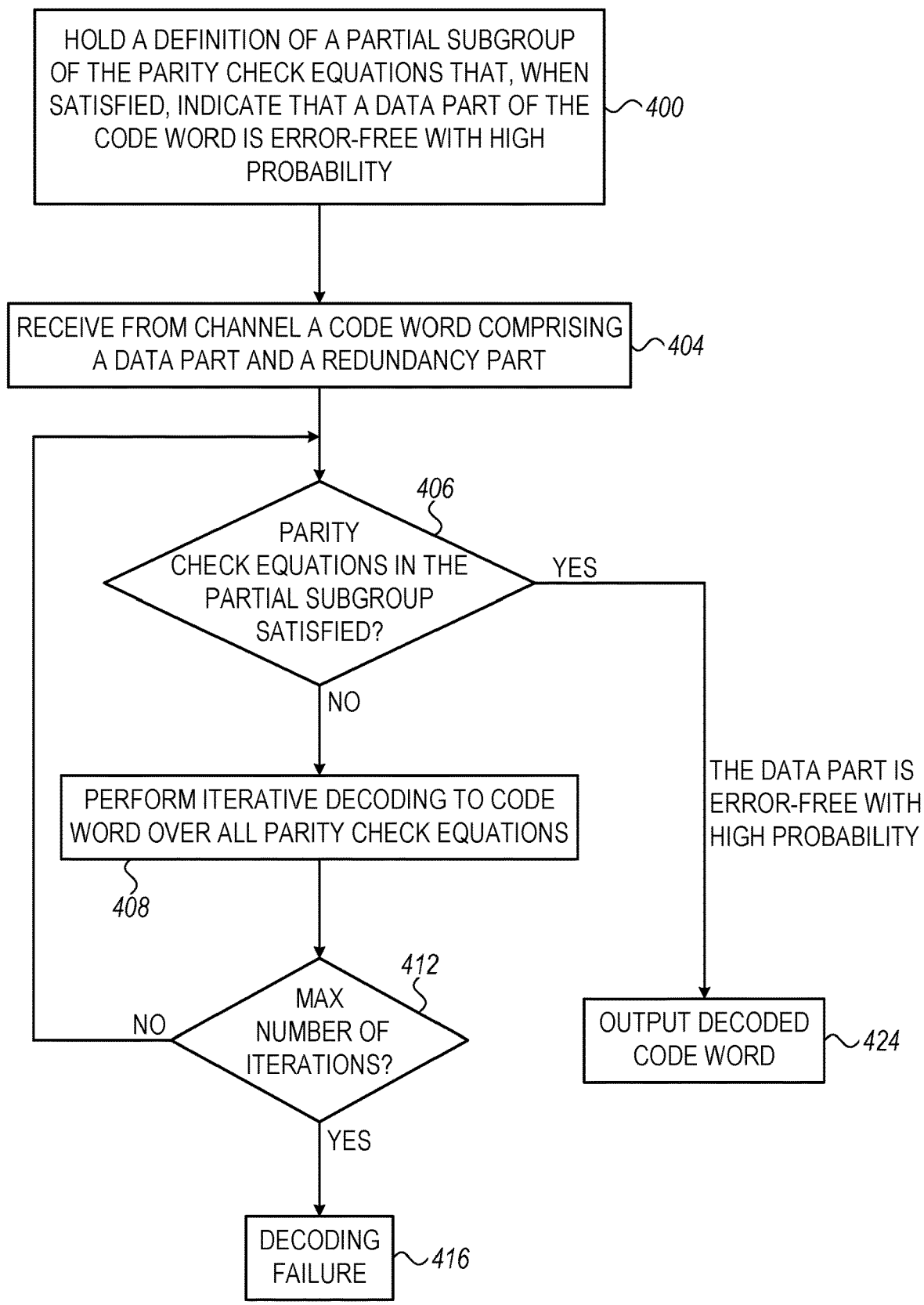
FIG. 4 is a flow chart that schematically illustrates a method for iterative ECC decoding with early termination, in accordance with an embodiment that is described herein.

FIG. 4 is a flow chart that schematically illustrates a method for iterative ECC decoding with early termination, in accordance with an embodiment that is described herein. The method will be described as being executed by LDPC decoder 300, for a LDPC code that is defined by a set of S parity check equations.

The method begins, at a definition step 400, with LDPC decoder 300 holding a definition of a partial subgroup of S'<S parity check equations that, when satisfied, indicate that the data part of the code word is error-free with high probability. For example, for the LDPC code defined by the parity check matrix of FIG. 3B, the total number of parity check equations is S=336 of which S'=294 parity check equations belong to the subgroup of step 400. The selection of the S' parity check equations for the subgroup at step 400 is typically carried out at design time.

At a reception step 404, the LDPC decoder receives a code word from the channel via interface 308. The received code word may contain one or more errors. The LDPC decoder may initialize VN register 330 based on the received code word. At a syndrome checking step 406, syndrome calculator 354 checks whether the S' parity check equations in the subgroup of step 400 are satisfied.

In response to determining at step 406 that at least one of the S' parity check equations is not yet satisfied, controller 326 may schedule, at an iterative decoding step 408, an iterative message exchange process between VN module 320 and CN module 324, for decoding the received code word. During the iterative process, the controller scans all of the S parity check equations. During the massage exchange process, the VN module updates the decoded bits in VN register 330 in an attempt to converge to a valid code word.

At an iteration count checking step 412, controller 326 checks whether a maximal number of iterations has been reached, and if not, the method loops back to step 406 to re-evaluate the S' parity check equations for possible early termination. Otherwise, the decoding has failed, and the LDPC decoder reports the failure at a failure step 416.

When at step 406 all of the S' parity check equations are satisfied, the decoder terminates the decoding, and outputs the decoded bits in VN register 330 as a decoded code word 312, via interface 308, at an output step 424.

In some embodiments, the LDPC decoder checks the S' parity check equations at step 406 in parallel to performing iterative decoding at step 408, and terminates decoding at mid iteration, when detecting that all of the S' parity check equations are satisfied.

The embodiments described above are given by way of example, and other suitable embodiments can also be used. For example, although the embodiments above mainly refer to iterative soft decoders, the disclosed embodiments are similarly applicable to an iterative hard decoder that receives a code word for decoding as a vector of binary values.

Although in the embodiments above we refer mainly to binary LDPC codes for which the parity check equations are defined in a Galois Field (GF) (2), these embodiments are applicable mutatis mutandis to any ECC that is represented by a set of check equations over any suitable GF. In such an ECC, the VN register holds variables in the underlying GF, and calculates the syndrome in the GF arithmetic.

In the embodiments described above, reducing the decoding time is achieved using a parity check matrix in which at least some of the parity bits participate in a number of check equations smaller than the data bits. A parity check matrix of this sort is commonly used in various LDPC codes, such as LDPC codes that are specified in the IEEE 802.11ad standard cited above. Such a matrix structure may be selected by design, e.g., to simplify the LDPC encoding process. For example, to simplify the encoding process, the right-hand part of the parity check matrix is commonly designed to have a lower triangular structure, e.g., as depicted in FIG. 3B. Alternatively, an "almost" lower triangular structure can be used, in which the parity bits of the rightmost columns participate in a small number of parity check equations, but in more than a single equation.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   an interface configured to receive a code word, which was produced in accordance with an Error Correction Code (ECC) represented by a set of parity check equations, wherein the code word comprises a data part and a redundancy part and contains one or more errors; and
   a decoder, configured to:
      decode the code word by performing an iterative decoding process on the set of parity check equations, so as to correct the one or more errors; and
      during the iterative decoding process, estimate whether the data part is error-free based on a partial subgroup of equations including fewer than all the parity check equations in the set, and, if the data part is estimated to be error-free, terminate the iterative decoding process,
   wherein the decoder estimates whether the data part is error-free in a manner such that in some cases the iterative decoding process is terminated despite the decoded code word still including errors.

2. The apparatus according to claim 1, wherein the decoder is configured to terminate the iterative decoding process even when one or more of the parity check equations, which do not belong to the partial subgroup, are not satisfied.

3. The apparatus according to claim 1, wherein the decoder is configured to estimate whether the data part is error-free by calculating a syndrome only over the parity check equations in the subgroup, and checking whether the syndrome is indicative of at least one unsatisfied parity check equation in the subgroup.

4. The apparatus according to claim 1, wherein each data bit in the data part of the code word participates in a predefined first number of the parity check equations, and wherein at least one redundancy bit in the redundancy part participates in a second number of the parity check equations that is smaller than the first number.

5. The apparatus according to claim 4, wherein the parity check equations not included in the partial subgroup of the parity check equations are those parity check equations that depend on the at least one redundancy bit that participate in the second number of the parity check equations.

6. The apparatus according to claim 1, wherein the decoder is configured to scan the parity check equations in W layers, wherein each of the W layers comprises a plurality of the parity check equations, and to hold the definition of the partial subgroup by identifying a partial subset of W' layers, wherein W'<W.

7. The apparatus according to claim 1, wherein each iteration of the iterative decoding process includes a complete scan over all the parity check equations, to correct errors.

8. The apparatus according to claim 1, wherein the partial subgroup of the parity check equations includes seven eighths of the equations in the set of parity check equations.

9. The apparatus according to claim 1, wherein the apparatus comprises a processor configured to verify that the decoded code word after termination of the iterative decoding process meets an error detection code, separate from the ECC.

10. An apparatus, comprising:
an interface configured to receive a code word, which was produced in accordance with an Error Correction Code (ECC) represented by a set of parity check equations, wherein the code word comprises a data part and a redundancy part and contains one or more errors; and
a decoder, configured to:
  decode the code word by performing an iterative decoding process on the set of parity check equations, so as to correct the one or more errors; and
  during the iterative decoding process, estimate whether the data part is error-free based on a partial subgroup of equations including fewer than all the parity check equations in the set, and, if the data part is estimated to be error-free, terminate the iterative decoding process,
wherein the decoder is configured to estimate whether the data part is error-free by calculating a syndrome only over the parity check equations in the subgroup, and checking whether the syndrome is indicative of at least one unsatisfied parity check equation in the subgroup,
wherein the decoder comprises (i) a register that stores decoded bits of the code word that update during the iterative decoding process, and (ii) a logic circuit that is hard-wired to bits of the register in accordance with the parity check equations in the subgroup, wherein the logic circuit is configured to perform, using the logic circuit, within a single clock cycle (i) reading the decoded bits from the register, and (ii) calculating the syndrome, based on the read bits, over the parity check equations in the subgroup.

11. A method, comprising:
in a decoder for an Error Correction Code (ECC) represented by a set of parity check equations, receiving a code word, which was produced in accordance with the ECC, wherein the code word comprises a data part and a redundancy part and contains one or more errors;
decoding the code word by performing an iterative decoding process on the set of parity check equations, so as to correct the one or more errors; and
during the iterative decoding process, estimating whether the data part is error-free based on a partial subgroup of equations including fewer than all the parity check equations in the set, and, if the data part is estimated to be error-free, terminating the iterative decoding process,
wherein estimating whether the data part is error-free is performed in a manner such that in some cases the iterative decoding process is terminated despite the decoded code word still including errors.

12. The method according to claim 11, wherein terminating the iterative decoding process comprises terminating the decoding process even when one or more of the parity check equations, which do not belong to the partial subgroup, are not satisfied.

13. The method according to claim 11, wherein estimating whether the data part is error-free comprises calculating a syndrome only over the parity check equations in the subgroup, and checking whether the syndrome is indicative of at least one unsatisfied parity check equation in the subgroup.

14. The method according to claim 13, wherein the decoder comprises (i) a register that stores decoded bits of the code word that update during the iterative decoding process, and (ii) a logic circuit that is hard-wired to bits of the register in accordance with the parity check equations in the subgroup, wherein estimating whether the data part is error-free comprises performing, using the logic circuit, within a single clock cycle (i) reading the decoded bits from the register, and (ii) calculating the syndrome, based on the read bits, over the parity check equations in the subgroup.

15. The method according to claim 11, wherein each data bit in the data part of the code word participates in a predefined first number of the parity check equations, and wherein at least one redundancy bit in the redundancy part participates in a second number of the parity check equations that is smaller than the first number.

16. The method according to claim 15, wherein the parity check equations not included in the partial subgroup of the parity check equations are those parity check equations that depend on the at least one redundancy bit that participate in the second number of the parity check equations.

17. The method according to claim 11, wherein decoding the code word comprises scanning the parity check equations in W layers, wherein each of the W layers comprises a plurality of the parity check equations, and wherein holding the definition of the partial subgroup comprises identifying a partial subset of W' layers, wherein W'<W.

18. The method according to claim 11, wherein each iteration of the iterative decoding process includes a complete scan over all the parity check equations, to correct errors.

19. The method according to claim 11, wherein the partial subgroup of the parity check equations includes seven eighths of the equations in the set of parity check equations.

20. The method according to claim 11, comprising verifying that the decoded code word after termination of the iterative decoding process meets an error detection code, separate from the ECC.

\* \* \* \* \*